United States Patent
Okada et al.

(10) Patent No.: US 6,858,271 B1
(45) Date of Patent: Feb. 22, 2005

(54) CONDUCTIVE ORGANIC COMPOUND DEVICE, CONDUCTIVE LIQUID CRYSTAL DEVICE, AND ORGANIC ELECTROLUMINESCENCE DEVICE

(75) Inventors: Shinjiro Okada, Isehara (JP); Akira Tsuboyama, Sagamihara (JP); Naoya Nishida, Chigasaki (JP); Takashi Moriyama, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 446 days.

(21) Appl. No.: 09/656,942

(22) Filed: Sep. 7, 2000

(30) Foreign Application Priority Data

Sep. 9, 1999 (JP) .......................................... 11-255007
Sep. 28, 1999 (JP) .......................................... 11-273878

(51) Int. Cl.[7] .................................................. H01J 1/62
(52) U.S. Cl. ........................ 428/1.4; 428/1.1; 428/690; 428/917; 349/183; 349/184; 349/125; 349/130; 313/499; 313/505; 313/506; 252/299.62
(58) Field of Search .......................... 428/1.1, 1.4, 690, 428/917, 1.5, 1.55, 704; 349/183–184, 125, 130; 313/499, 505–506; 252/299.62

(56) References Cited

U.S. PATENT DOCUMENTS

| | | | |
|---|---|---|---|
| 5,766,510 A | * 6/1998 | Hanna et al. | .......... 252/299.62 |
| 5,858,273 A | 1/1999 | Asaoka et al. | ........... 252/299.4 |
| 5,976,284 A | * 11/1999 | Calvert et al. | ................. 156/51 |
| 6,017,470 A | * 1/2000 | Katz et al. | .................. 252/582 |
| 6,150,042 A | * 11/2000 | Tamano et al. | ............. 428/690 |
| 6,159,562 A | * 12/2000 | Kanbe et al. | ................. 428/1.1 |
| 6,528,940 B1 | * 3/2003 | Okada et al. | ............... 313/505 |
| 6,650,387 B1 | * 11/2003 | Asao et al. | .................. 349/133 |

OTHER PUBLICATIONS

Polymers for Advanced Technologies, vol. 8 (1997), pp. 459–464.
Nature, vol. 371 (Sep. 1994), pp. 141–143.
Liquid Crystals, vol. 23, No. 4, pp. 613–617.
Macromol, Symp., vol. 125 (1997), pp. 1–48.
Polymers for Advanced Technologies, vol. 9 (1998), pp. 443–460.
Advanced Materials, vol. 9, No. 1 (1997), pp. 48–52.

* cited by examiner

Primary Examiner—Harold Pyon
Assistant Examiner—Sow-Fun Hon
(74) Attorney, Agent, or Firm—Fitzpatrick, Cella, Harper & Scinto (57) ABSTRACT

A conductive organic compound device structure suitable for constituting an electronic device, such as an organic EL device, is formed by including a pair of oppositely spaced electrodes, and a carrier transporting layer disposed between the electrodes and in contact with one of the electrodes. The carrier transporting layer comprises a conductive organic compound having a π-electron resonance structure in its molecule. In the device, the π-electron resonance structure plane of the conductive organic compound in the carrier transporting layer is aligned substantially parallel to surfaces of the electrodes. The conductive organic compound is preferably a conductive liquid crystal, such as a discotic liquid crystal or a smectic liquid crystal, and a layer thereof is included in the device, preferably by vacuum deposition.

4 Claims, 3 Drawing Sheets

CONDUCTIVE ORGANIC COMPOUND DEVICE, CONDUCTIVE LIQUID CRYSTAL DEVICE, AND ORGANIC ELECTROLUMINESCENCE DEVICE

FIELD OF THE INVENTION AND RELATED ART

The present invention relates to an (electro)conductive organic compound device used in electronic devices, an (electro)conductive liquid crystal device, and an organic electroluminescence device using the liquid crystal device.

As for organic electroluminescence devices (hereinafter, the term "electroluminescence" being sometimes abbreviated as "EL" according to a common usage in the field), carrier injection-type EL devices utilizing organic solids, such as anthracene single crystal, were studied in detail. These devices were of a single layer-type, but thereafter Tang, et al. proposed a lamination-type organic EL device comprising a luminescent layer and a hole transporting layer between a hole injecting electrode and an electron injecting electrode. The luminescence mechanism in these injection-type EL devices commonly includes stages of (1) electron injection from a cathode and hole injection from an anode, (2) movement of electrons and holes within a solid, (3) recombination of electrons and holes, and (4) luminance from single term excitons.

A representative example of the lamination-type EL device may have a structure including an ITO film as a cathode formed on a glass substrate, an approximately 50 nm-thick layer formed thereon of TPD (N,N'-diphenyl-N, N'-di(3-methylphenyl)-1,1'-biphenyl-4,4'-diamine) having a structure of a formula shown below, an approximately 50 nm-thick layer thereon of Alq3 (tris(8-quinolinolato)-aluminum), and further a vapor deposition layer of Al—Li alloy as a cathode.

TPD

By setting the work function of the ITO used as the anode at 4.4–5.0 eV, the hole injection to TPD is made easier, and the cathode is composed of a metal which has as small a work function as possible and also is stable. Examples of the cathode metal may include Al—Li alloy as mentioned above and also Mg—Ag alloy. By the above organization, green luminescence may be obtained by applying a DC voltage of 5–10 volts.

An example using a conductive liquid crystal as a carrier transporting layer is also known. For example, D. Adam et al. (Nature, Vol. 371, p. 141–143) reported that a long-chain triphenylene compound as a discotic liquid crystal material exhibited a mobility of $10^3$–$10^{-2}$ cm$^2$/V.sec in its liquid crystal phase (Dh phase) and a mobility of $10^{-1}$ cm$^2$/V.sec in its mesophase (an intermediate phase, not a liquid crystal phase). Also, as for a bar-shaped liquid crystal, Junichi Hanna (Ohyou Butsuri (Applied Physics), Vol. 68, No. 1, p. 26) reported that a phenylnaphthalene compound exhibited a mobility of $10^{-3}$ cm$^2$/V.sec or higher in its smectic B phase.

As a trial for using such a liquid crystal for electroluminescence, Ingah Stapff et al. (Liquid Crystals, Vol. 23, No. 4, pp. 613–617) reported an organic EL device using a triphenylene-type discotic liquid crystal. Other reports are found in Polymers for Advanced Technologies, Vol. 9, pp. 460–463 (1998), and Advanced Materials (1997), Vol. 9, No. 1, p. 48.

Figure 5:
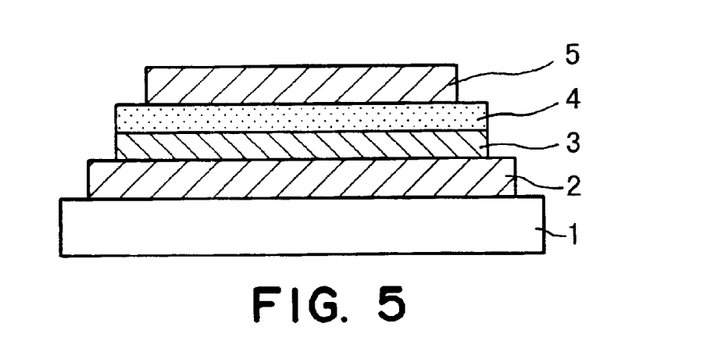
FIGS. 5 and 6 are schematic sectional views of a known organic EL device.
Figure 6:
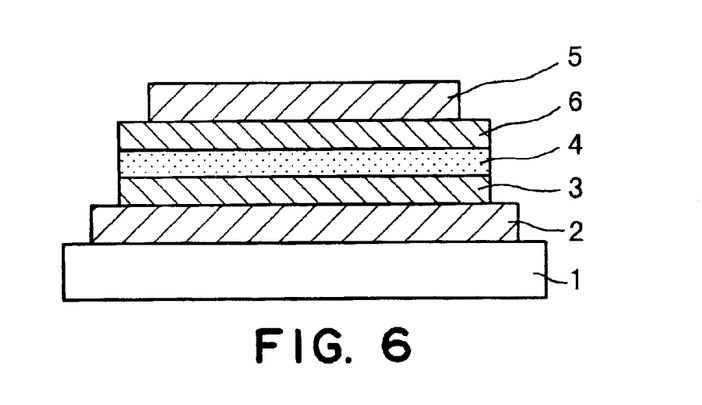

A description of a basic structure of an organic EL device is supplemented with reference to FIGS. 5 and 6 which illustrate organic EL devices including transparent substrates 1 and 2, a charge transporting layer 3, a luminescence layer 4, and a metal electrode 5 (and an electron transporting layer 6).

As shown in FIGS. 5 and 6, an organic EL device generally includes a plurality of organic layers disposed between a transparent electrode 2 formed on a transparent substrate 1 and a metal electrode 5 disposed opposite to the transparent electrode 2. In the device of FIG. 5, the organic layers comprise a luminescence layer 4 and a hole transporting layer 3. The transparent electrode 2 is composed of ITO (indium tin oxide), etc., having a relatively large work function so as to provide a good hole injection performance to the hole transporting layer 3. The metal electrode 5 is composed of a metallic material having a relatively small work function, such as aluminum, magnesium, or alloys of changing performance to the organic layers. These electrodes may have a thickness of 50–200 nm.

The luminescence layer 4 may, for example, comprise an aluminum quinolinol complex (a representative example of which is Alq3 (tris(8-quinolinolato)aluminum) as mentioned above, which has the structure shown below). The hole transporting layer 3 may comprise an electron donative material, such as a triphenyldiamine derivative (representative examples of which may include α-NPD (bis[N-(1-naphthyl)-N-phenyl]benzidine) which has the structure shown below).

Alq3 a-NPD

An organic EL device, having an organization shown in FIG. 5, exhibits a rectifying characteristic, and if an electric field is formed so that the metal electrode 5 forms a cathode and the transparent 2 forms an anode, electrons are injected into the luminescence layer 4 from the metal electrode, and holes are injected into the hole transporting layer 3 from the transparent electrode 2. The injected holes and electrons are recombined in the luminescence layer 4 to generate excitons, thus causing luminescence. In this instance, the hole transporting layer 3 functions as an electron blocking layer to increase the recombination efficiency at the luminance layer/hole transporting layer boundary, thus providing an increased luminance efficiency.

In an organic EL device of FIG. 6, an electron transporting layer 6 is disposed between the metal electrode 5 and the luminance layer 4 described with reference to FIG. 5. In the device of this organization, the luminance function and the electron and hole transporting functions are separated to provide a more effective carrier blocking function, thereby allowing effective luminance. The electron transporting layer 6 may for example comprise an oxadiazole derivative.

In the above-mentioned conventional organic EL devices, the organic (compound) layers may have a thickness on the order of 50–500 nm in total of the two or three layers.

The above-mentioned conventional organic EL devices involve a problem that a short circuit is liable to occur between the electrodes since a high electric field of approximately 100 mV/cm is applied across thin layers with a thickness of approximately 100 nm. This problem can be alleviated to some extent by increasing the number of organic layers, but this can invite a problem in productivity. The reason a high electric field on the order of 100 MV/cm is applied is because the carrier mobility of the organic layers is low. Therefore, the applied electric field can be lowered, if the organic layers can be formed so as to exhibit a higher mobility. A carrier transporting layer generally used in a current organic EL device exhibits a mobility on the order of $10^{-5}$–$10^{-3}$ cm$^2$/V.sec, and a mobility on the order of $10^{-3}$ cm$^2$/V.sec, which is said to be a limit even for an amorphous material.

The luminance efficiency is also affected by the carrier injection performances of the electrodes. The carrier injection performance in the case of using an amorphous material is said to determine the luminance efficiency, and an amorphous material is not necessarily considered to be a material having a sufficient carrier injection performance.

For the above reason, a new type of luminescence layer or carrier transporting layer using a conductive liquid crystal compound having a higher mobility is expected. Such a conductive liquid crystal having a high carrier transporting performance may, for example, include a discotic liquid crystal and a smectic liquid crystal having a high degree of order.

As an example of organic EL device using a conductive liquid crystal as mentioned above, Wendorff et al. (Polym. Adv. Technol. p. 443–460 (1998)) reported a luminance device wherein a film of discotic liquid crystal is formed by spin coating, and a luminance layer is formed thereon by the LB (Langmuir-Blodgett) technique. This report contains a description to the effect that the luminescence device having the above organization caused EL luminance. Regarding the liquid crystal alignment, the liquid crystal, after film formation, was in an undesirable homogeneous alignment. It was then subjected to a realigning treatment including heating up to a liquid phase temperature and cooling to a liquid crystal phase, thereby providing a desired liquid crystal alignment.

An organic layer in a conventional organic EL device has been of a monomeric amorphous type and has been formed by vacuum evaporation, so that it has been difficult to provide a thickness in excess of 1 $\mu$m in view of the productivity. Accordingly, the total thickness of the organic layers has generally been as thin as 100 nm–200 nm, and this has been accompanied with several problems.

More specifically, as the organic layers are thin, an electrical short circuit is liable to occur between the electrodes. Further, due to the necessity of carrier injection, an insulating layer cannot be inserted, like it can in inorganic EL devices, to obviate the above problem. As a result, the organic EL device has involved a problem regarding drive stability as an electronic device.

Further, as the organic layers between the electrodes are thin, the device capacitance is increased to cause a large drive current. This incurs an increase in power consumption and is not desirable.

Moreover, as briefly mentioned above, in a conventional organic EL device, a high electric field (on the order of 10 V/100 nm) has been required for drive because of low performances of injection of electrons and holes from the electrodes, such as ITO, to the organic layers. As organic materials used in an organic EL device have a band gap as broad as approximately 3.0 eV or more, thermal excitation-type free electrons are not present in a conduction band (or LUMO: Lowest Unoccupied Molecular Orbital), and a drive current is principally supplied by a tunnel current injected from the electrodes. The injection efficiency of the current is known to be remarkably affected not only by the work functions of the electrodes and a level gap between the LUMO and HOMO (Highest Occupied Molecular Orbital) of the organic materials, but also by the molecular alignment and structure of the organic materials. For example, in the case where organic molecules assume a crystalline state, minute crystalline boundaries function as carrier conduction obstacles. Therefore, organic materials are generally used in an amorphous state, but only a low carrier injection efficiency is available in this case.

For the above reason, in order to attain a sufficient drive current by using ordinary organic compounds (such as TPD, α-NPD (bis[N-(1-naphthyl)-N-phenyl]benzidine), TAZ-01 (3-(4-biphenylil)-4-phenyl-5-(4-tert-butylphenyl)-1,2,4-triazol), Alq3, etc.) in ordinary EL devices, it has been necessary to apply a high electric field (on the order of 10 V/100 nm) across the organic layer-electrode boundaries. Further, as the mobility of the organic materials is on the order of $10^{-3}$–$10^{-5}$ cm$^2$/V.cm, it is also necessary to apply a high electric field in order to ensure a drive current.

The application of such a high electric field leads to the necessity of thin device layers, which also leads to an electrical short circuit between the electrodes and an increase in capacitance load.

Further, an organic EL device is liable to be affected by invaded moisture, which causes deterioration of luminance performance and drive performance, and thus poor durability. In an ordinary organic EL device, the organic layers are disposed in lamination, and then the cathode is formed thereon by vapor deposition of a metal film. In this instance, a metal species having a small work function suitable for the cathode is susceptible to oxidation and has low durability. Even in case of forming a protective film thereon by sputtering, the organic layers are liable to be degraded if the forming temperature is high (with an ordinary limit of 100° C.), and the destruction of the device structure due to film stress is also problematic.

On the other hand, the following problems are also encountered. According to our experiments, a conductive liquid crystal layer formed by spin coating leaves problems regarding thickness uniformity, microscopic liquid crystal alignment uniformity and film uniformity. The alignment uniformity can be evaluated by the presence or absence of light leakage due to birefringence of the liquid crystal by observation through a cross nicol polarizing microscope. A conductive liquid crystal layer formed by spin coating is liable to involve portions of good alignment and poor alignment in mixture, and this may be attributable to non-uniformity of vaporization of the solvent. Even if a liquid crystal layer is formed with little alignment irregularity by spin coating, it is difficult to provide satisfactory current and luminance performances. This may be attributable to a problem inherent in a wet forming process using a solvent, i.e., inevitable entrapment of impurities liable to function as a carrier trap. Thus, the formation of a conductive liquid crystal layer may be inevitably accompanied with problems, such as nonuniformity of liquid crystal layer thickness, nonuniformity of liquid crystal alignment and entrapment of impurities, and is considered to be unsuitable for providing a high-performance organic EL device using a liquid crystal. On the other hand, a Langmuir-Blodgett film is in a high-order state, which is different from an amorphous state but is close to a crystal state, and may include crystal defects functioning as a carrier trap, thus leaving problems regarding the carrier transportation and luminance performances.

SUMMARY OF THE INVENTION

A generic object of the present invention is to provide improvements to problems as mentioned above encountered in organic EL devices proposed heretofore.

A more specific object of the present invention is to provide an organic EL device which requires a small power consumption and is excellent in reliability and durability.

Another object of the present invention is to realize a carrier transporting layer exhibiting a high carrier injection efficiency from an electrode to organic layers, thus providing an organic EL device rich in durability by using thick organic layers including the carrier transporting layer.

Another object of the present invention is to provide an organic EL device having a high reliability and including a carrier transporting layer or a luminance layer exhibiting a better performance by utilizing a liquid crystal compound having a high mobility.

A further object of the present invention is to provide a conductive organic compound device and a conductive liquid crystal device having a structural feature common to an organic EL device satisfying the above objects.

According to the present invention, there is provided a conductive organic compound device, comprising: a pair of oppositely spaced electrodes, and a carrier transporting layer disposed between the electrodes and in contact with one of the electrodes; wherein the carrier transporting layer comprises a conductive organic compound having a π-electron resonance structure in its molecule, and the π-electron resonance structure plane of the conductive organic compound in the carrier transporting layer is aligned substantially parallel to surfaces of the electrodes.

The present invention further provides a conductive liquid crystal device obtained by using a conductive liquid crystal instead of the conductive organic compound in the above conductive organic compound device.

According to another aspect of the present invention, there is provided an organic EL device, comprising: a pair of oppositely spaced electrodes, and a carrier transporting layer and a luminescent organic layer disposed in lamination between the electrodes so that the carrier transporting layer is disposed in contact with one of the electrodes; wherein the carrier transporting layer comprises a conductive liquid crystal having a π-electron resonance structure in its molecule, and the π-electron resonance structure plane of the conductive liquid crystal in the carrier transporting layer is aligned substantially parallel to surfaces of the electrodes.

According to still another aspect of the present invention, there is provided a conductive liquid crystal device, comprising: a pair of oppositely spaced electrodes, and at least one conductive liquid crystal layer formed by vacuum deposition of a conductive liquid crystal and assuming a liquid crystal state and an amorphous layer formed by vacuum deposition of a conductive organic compound and contacting the conductive liquid crystal layer, respectively disposed between the electrodes.

By using either one of the conductive liquid crystal layer and the amorphous layer as a luminescence layer, there is also provided an organic electroluminescence device.

By using the conductive organic compound device or the conductive liquid crystal device having a carrier transporting layer exhibiting a high carrier injection efficiency, it is possible to constitute an electronic device requiring a reduced power consumption. According to the organic EL device of the present invention, the total thickness of the organic layers including the conductive liquid crystal layer can be increased, so that it is possible to provide a reliable EL device. Further, by forming a cell structure including a glass substrate, etc., it is possible to provide an EL device having a high durability.

Further, by adopting a device structure including an amorphous layer in addition to a conductive liquid crystal layer, it becomes possible to more effectively utilize the high carrier mobility characteristic of the conductive liquid crystal layer, thus further increasing the reliability. Accordingly, it is possible to provide an organic EL device having a high luminance intensity at a lower voltage. Because of the lower voltage, the short circuit between the electrodes is less liable to occur, thus improving the reliability also in this respect.

These and other objects, features and advantages of the present invention will become more apparent upon a consideration of the following description of the preferred embodiments of the present invention taken in conjunction with the accompanying drawings, wherein like parts are denoted by like reference numerals.

DESCRIPTION OF THE PREFERRED EMBODIMENTS

According to a first embodiment of the present invention, an (electro)conductive organic compound having a π-electron resonance structure in its molecule is used to form a carrier transporting layer, wherein the π-electron resonance structure plane of the conductive organic compound is aligned substantially parallel to an associated electrode surface, thereby improving the carrier injection performance from the electrode boundary. A conductive organic compound device, particularly a conductive liquid crystal device using a conductive liquid crystal as the conductive organic compound, including such a carrier transporting layer, can be applied to electronic devices, such as a photo-sensor, a photoconductor (for constituting, e.g., a photosensitive drum for copying machines), an organic semiconductor device (such as an organic TFT (thin film transistor)), a temperature sensor, and a spatial modulation device, and is particularly preferable to an organic EL device.

If a conductive liquid crystal is used as the conductive organic compound for a carrier transporting layer, it becomes easy to align the π-electron resonance plane thereof parallel to the associated electrode surface. The conductive liquid crystal aligned in this manner can take advantage of the following effects:

(1) Some conductive liquid crystals have a mobility exceeding $10^{-2}$ cm$^2$/V.sec (D. Adam, et al., Nature, Vol. 371, p. 141–143).

(2) A conductive liquid crystal has an alignment characteristic that causes a phase transition into smectic phase, nematic phase or isotropic phase at high temperatures and can be used in an aligned state as in an ordinary liquid crystal device used for display. By utilizing such an alignment characteristic, a thick organic layer can be formed. Further, by adopting a cell structure using oppositely disposed glass substrates, it is possible to prevent the deterioration due to invasion of moisture, etc.

(3) In the case of using a discotic liquid crystal as a conductive liquid crystal, a discotic liquid crystal generally has a structure including a core of, e.g., triphenylene, and side chains attached to the periphery of the core for developing mesomorphism (liquid crystal property). The side chains generally exhibit poor wettability with a substrate of a metal or a metal oxide (such as ITO), so that in the liquid crystal state of the discotic liquid crystal, the core is aligned parallel to the electrode surface, whereby the π-electron resonance plane of the core is aligned parallel to the electrode surface, thereby facilitating carrier transfer with the electrode. Accordingly, it is possible to provide a higher injection efficiency than an ordinary organic compound in an amorphous state.

In this way, by aligning a discotic liquid crystal having hydrophobic side chains relative to an electrode surface, it is possible to improve the efficiency of carrier injection from the electrode to the organic layers. This effect can also be expected for an ordinary bar-shaped liquid crystal having a molecular structure including a phenyl group or a naphthalene group having a π-electron resonance plane, and the alignment of such a π-electron resonance can improve the interaction with the electron cloud given by atoms of the electrode, thereby improving the carrier injection from the electrode.

(4) A molecule exhibiting mesomorphism can change a molecular disposition relative to an electrode surface by a realigning post-treatment. This can also facilitate the injection efficiency.

As mentioned above, in the first embodiment of the present invention, the π-electron resonance structure plane of the conductive organic compound (or the conductive liquid crystal compound) is required to be aligned substantially parallel to the electrode surfaces. This is satisfied not only where the π-electron resonance structure plane is completely parallel to the electrode surfaces but also where the resonance structure plane is aligned with some insubstantial inclination angle, i.e., 45 deg. at the maximum, from the extension of the surface of the opposite electrode disposed closer to the conductive organic compound (or liquid crystal) layer.

According to a second embodiment, a conductive liquid crystal layer formed by vacuum deposition is used for providing a high-performance device, particularly an organic EL device. According to this embodiment, it is possible to take advantage of the following effects attributable to the vacuum deposition scheme in general:

(1) The vacuum deposition process inherently provides a film with a minimum level of impurities that are liable to function as a carrier trap.

(2) It is possible to relatively easily form a film with high avenues and uniformity at a molecular level and also a macroscopic level.

According to our experiments, it has been found possible to take advantage of the following effects by forming a layer of liquid crystal compound by vacuum deposition:

(3) It is possible to realize a liquid crystal layer having a good alignment order by vacuum deposition of a liquid crystal compound at a temperature in its liquid crystal phase temperature range. As a result, it is possible to attain current and luminance performances attributable to good carrier-transporting performance.

(4) If a liquid crystal compound is vacuum deposited in a phase below a liquid crystal phase, e.g., a crystal phase, it is possible to obtain a liquid crystal (compound) layer in a good film state even in a crystal temperature range.

(5) By heating a device including the film of (4) above to a liquid crystal phase temperature range, the liquid crystal is aligned to provide current and luminance performances attributable to better carrier-transporting performance in the liquid crystal alignment.

(6) If an amorphous layer formed by vacuum deposition is disposed in lamination with a conductive liquid crystal layer, the liquid crystal contacting the amorphous layer can be aligned because of an alignment control power of the amorphous layer. In this instance, the amorphous layer exerts an alignment control power for causing a homeotropic alignment of a discotic liquid crystal and a homogeneous alignment of a smectic liquid crystal.

(7) In the case where the conductive liquid crystal layer is laminated with the amorphous layer, a good carrier transportation is effected through the boundary therebetween.

(8) In the case where a liquid crystal layer is formed by vacuum deposition, unlike the case of spin coating or injection, a realignment step of heating to a liquid phase temperature becomes unnecessary. Further, according to vacuum deposition, it is possible to form a liquid crystal layer of sub-micron thickness with good uniformity, evenness and alignment characteristic.

Hereinbelow, the present invention will be described more specifically with reference to an organic EL device as an embodiment of the conductive organic compound device and the conductive liquid crystal device of the present invention.

The organic EL device according to the present invention can have basically similar organizations, as shown in FIGS.

5 and 6, of conventional organic EL devices. Further, the organic EL device can comprise a transparent substrate 1, a transparent electrode 2 and a metal electrode 5, which are similar in structure and can comprise similar materials as the corresponding members described with reference to FIGS. 5 and 6.

In the present invention, the π-electron resonance structure of the conductive organic compound or the conductive liquid crystal constituting the carrier transporting layer is generally given by an aromatic ring, examples thereof may include: triphenylene ring, naphthalene ring and benzene ring, as representative, and also pyridine ring, pyrimidine ring, pyridazine ring, pyrazine ring, tropone ring, azulene ring, benzofuran ring, indole ring, indazole ring, benzothiazole ring, benzoxazole ring, benzimidazole ring, quinoline ring, isoquinoline ring, quinazoline ring, quinoxaline ring, phenanthrene ring and anthracene ring.

The conductive liquid crystal used in the present invention may preferably comprise a discotic liquid crystal or a smectic liquid crystal. A discotic liquid crystal may generally have a core structure which may be given by an aromatic ring as mentioned above for the π-electron resonance structure, as represented by triphenylene ring (or skeleton). Further examples thereof may include truxene skeleton, metal-phthalocyanine skeleton, phthalocyanine skeleton, dibenzopyrene skeleton, metal-phthalocyanine skeleton, dibenzopyrene skeleton, and hexabenzocoronene skeleton.

The discotic liquid crystal used in the present invention may preferably be a liquid crystal having a discotic disordered phase or a liquid crystal phase having a lower order than the discotic disordered phase. More specifically, it is preferred to use a liquid crystal having a discotic disordered phase or a discotic nematic phase.

Examples of the discotic liquid crystal may include LC Compounds 1–5 represented by the following structural formulae (as shown in Advanced Materials, 1996, Vol. 8, No. 10).

LC Compound 1: R=SC$_6$H$_{13}$

LC Compound 2: R=OC$_4$H$_9$

LC Compound 3: R=OC$_5$H$_{11}$

LC Compound 4: R=OC$_6$H$_{13}$

LC Compound 5:

The above-mentioned LC compounds 1–4 having side chains of thioether group (—SC$_6$H$_{13}$) or alkoxy groups (—OC$_4$H$_9$, etc.) are known to have a hole-transporting characteristic at a high mobility ($10^{-1}$–$10^{-3}$ cm$^2$/V.sec). Each of these compounds has a discotic columnar phase, and the disk-shaped molecules thereof are aligned so as to form columns, such that triphenylene skeletons thereof having abundant π-electron planes are mutually overlapped, whereby it is possible to attain a good hole-transporting performance via the triphenylene skeletons.

To supplement, the discotic liquid crystal phases may be classified into discotic nematic phase and discotic columnar phase, and the discotic columnar phase is further divided into discotic disordered phase and discotic ordered phase which has a higher order than the discotic disordered phase.

A higher mobility is exhibited by a liquid crystal having discotic ordered phase, but in view of a carrier injection performance from an electrode surface, a liquid crystal having discotic disordered phase can exhibit a better performance because its π-electron resonance plane can be better aligned in parallel to the electrode surface according to the present invention, thus being preferably used to constitute a carrier transporting layer according to the present invention.

Incidentally, in the case of passing across a layer of organic compound sandwiched between a pair of electrodes, the carrier injection is effected by a tunnel current or a Schottky current depending on an energy barrier at the injection boundary. And, if the injection barrier is sufficiently low and the carrier is sufficiently injected, the current flows as a spatial charge controlling current proportional to the mobility. Accordingly, in order to obtain an effective current flow, it is preferred to improve the injection performance at a proximity to the boundary and use a material having an internally large mobility.

Accordingly, in the case of using a discotic liquid crystal for a carrier transporting layer, it is also preferred to use a two layer-structured liquid crystal layer including a lamination of a layer of discotic liquid crystal showing discotic disordered phase at the boundary with the electrode and a layer of discotic liquid crystal showing discotic ordered phase on a remoter side from the electrode. As such a discotic liquid crystal having discotic ordered phase, HBOT (hexabisbutyloxytriphenylene) represented by the following formula may, for example, be preferably used.

HBOT

R: C$_4$H$_9$O

On the other hand, the smectic liquid crystal used in the present invention may preferably be a smectic liquid crystal having SmE phase or a smectic phase of a lower order than SmE phase. More specifically, it is preferred to use a liquid crystal having SmE phase or SmB phase. As such a smectic liquid crystal having SmE phase, PN84 (2-butoxy-6-(3-octylphenyl)naphthalene) may, for example, be preferably used.

PN83

Examples of other smectic liquid crystals may include LC Compounds 6 and 7 represented by structural formulae shown below (as disclosed in Ohyou Butsuri (Applied Physics), Vol. 68, No. 1, p. 26-(1999)). LC Compound 6 is a phenylbenzothiazole derivative having SmA phase and has a hole-transporting characteristic. LC Compound 7 is a phenylnaphthalene derivative having SmA phase and SmE phase (higher order phase), a higher mobility in the SmE phase, and a bipolar transporting characteristic of transporting both holes and electrons.

LC Compound 6

LC Compound 7

In addition to the above-mentioned examples of smectic liquid crystals, it is also possible to use liquid crystal compounds having a bar-shaped structure.

In the present invention, it is also possible to dispose an amorphous layer formed by vacuum deposition of an organic compound in lamination with the conductive liquid crystal layer. In this case, it is possible to use either one of the conductive liquid crystal layer and the amorphous layer as a luminance layer.

Examples of the organic compound constituting the amorphous layer in the present invention may include known luminescence materials and carrier-transporting materials inclusive of Alq3 and α-NPD mentioned above and compounds disclosed in Macromol. Symp. 125, pp. 1–48 (1997).

The carrier transporting layer of a conductive liquid crystal according to the present invention may be formed by vacuum deposition on an electrode. The layer of conductive liquid crystal after the vacuum deposition is assumed to have an amorphous state, i.e., an isotropic, indefinite and bulky alignment state. Liquid crystal molecules in such an alignment state can readily cause an alignment change at a liquid crystal phase temperature. Accordingly, in a device including a carrier transporting layer formed by vacuum deposition of a conductive liquid crystal, it is possible to easily realign the π-electron resonance phase parallel to an associated electrode surface by an appropriate heating treatment, thereby attaining a high carrier injection efficiency.

As for the electrode materials used in the present invention, examples of the anode materials may include: indium oxide, tin oxide, Cd$_2$SnO$_4$, zinc oxide, copper iodide, gold and platinum, in addition to ITO. Examples of the cathode materials may include: alkali metals, alkaline earth metals and alloys thereof, including sodium, potassium, magnesium, lithium, sodium-potassium alloy, magnesium-indium alloy, magnesium-silver alloy, aluminum, aluminum-lithium alloy, aluminum-copper alloy, aluminum-copper-silicon alloy.

Further, examples of materials for the luminescent organic layer may include: in addition to Alq3, BeBq (bis(benzoquinolinolato)beryllium), DTVB2 (4,4'-bis(2,2-di-p-tolylvinyl)biphenyl), Eu(DBM)3(Phen)(tris(1,3-diphenyl-1,3-propanediono)-monophenanthroline)Eu(III), and further, diphenyl-ethylene derivatives, triphenylamine derivatives, diaminocarbazole derivatives, bisstyryl derivatives, benzothiazole derivatives, benzoxazole derivatives, aromatic diamine derivatives, quinacridone compounds, perylene compounds, oxadiazole derivatives, coumarin compounds, and anthraquinone derivatives. These materials are preferably formed in an amorphous state by vacuum deposition.

Figure 1:
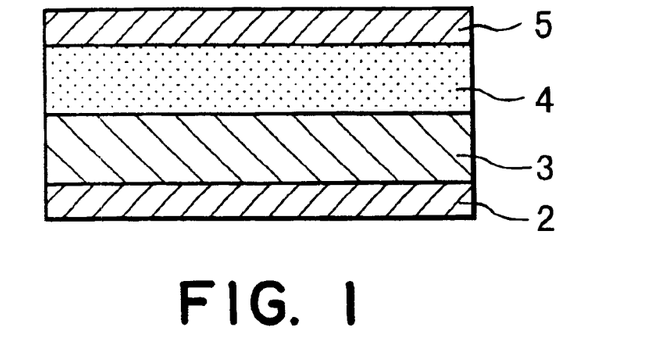
FIG. 1 is a schematic sectional view for illustrating a basic structure of an organic EL device according to an embodiment of the invention.

FIG. 1 is a schematic sectional view showing a basic structure of an embodiment of the organic EL device according to the present invention. Referring to FIG. 1, the organic EL device includes an anode 2, a carrier transporting layer 3, a luminescent organic layer 4 and a cathode 5, laminated in this order. In this embodiment, the carrier transporting layer 3 comprises a hole-transporting conductive liquid crystal having HOMO close to the energy level of ITO constituting the anode 2 and is disposed in contact with the anode 2. A carrier transporting layer comprising a conductive liquid crystal having an electron-transporting characteristic and disposed in contact with the cathode 5 is expected to have a similar effect of improving the carrier injection from the electrode.

Hereinbelow, the present invention will be described more specifically based on Examples.

EXAMPLE 1

Figure 2:
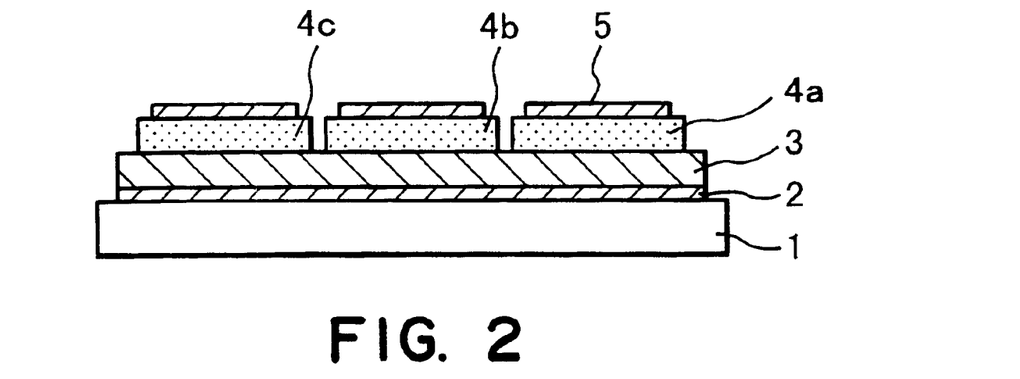
FIG. 2 is a schematic sectional view of an organic EL device prepared in an Example of the invention.

An organic EL device having a sectional structure as shown in FIG. 2 was prepared. FIG. 2 shows a similar structure as in FIG. 1 but shows a glass substrate 1 supporting the anode 2 and luminance layers 4a, 4b and 4c of different colors instead of the single luminance layer 4 in FIG. 1.

More specifically, on a glass substrate 1 held at 200° C., a 70 nm-thick ITO film was formed as a hole-injecting anode 2 by sputtering with a target of In 90% and Sn 10% while flowing Ar gas at 200 sccm and $O_2$ gas at 3 sccm. The ITO film showing a work function of approximately 4.35 eV was exposed to ultraviolet rays from a low-pressure mercury lamp to have an elevated work function of 4.60 eV.

The above-treated substrate 1, having an ITO film 2, was placed in a vacuum chamber held at a pressure below $2\times10^{-5}$ torr, and an approximately 50 nm-thick layer of HHOT (hexabishexyloxytriphenylene) was formed on the ITO film 2 as a carrier transporting layer 3 by vacuum deposition at a rate of approximately 0.1 nm/sec and a pressure of $1\times10^{-5}$ torr according to the resistance heating vacuum deposition method. HHOT exhibited a mobility of $1\times10^{-3}$ $cm^2/V.sec$ at approximately 70° C. or below according to the time-of-flight method when sandwiched in a 15 μm-thick layer between a pair of ITO substrates. Incidentally, HHOT is a discotic liquid crystal causing a transition from crystal to discotic disordered phase at 65° C. and a transition to isotropic phase at 98° C.

Luminescent organic layer segments 4a–4c, exhibiting different luminescent wavelengths, were respectively formed in a thickness of 50 nm on the HHOT layer 3 by vacuum deposition through a mask under the conditions of a pressure of $1\times10^{-5}$ torr and a deposition rate of approximately 0.1 mm/sec. The organic layers 4a–4c were respectively formed of Alq3 alone, Alq3 doped with 5 wt. % of perylene for shifting the luminescence wavelength to a shorter wavelength side, and Alq3 doped with 5 wt. % of DCM (a styryl dye) for shifting to a longer wavelength side. The structural formulae for the above-mentioned Alq3, perylene, and DCM are shown below.

Alq3 perylene

DCM

The above-prepared organic layers 4a–4c were respectively coated with cathode metals 5 each comprising a 50 nm-thick layer of Al—Li alloy (Li content=1.8 wt. %) and a 150 nm-thick Al layer, respectively formed by vacuum deposition, to obtain an organic EL device having a structure as shown in FIG. 2. The device was heated to 65° C., whereby electroluminescence was realized at an increased current at that temperature. In the device at 65° C., it was confirmed that the liquid crystal in the carrier transporting layer 3 on the ITO electrode 2 was aligned so that the discotic columns thereof were aligned substantially vertical to the electrode surface. (The liquid crystal alignment was confirmed by using a sample device having a layer structure of ITO (70 nm)/HHOT (50 nm)/Alq3 (10 nm)/Al (10 nm) and observing it though a right-angle cross nicol polarizing microscope, whereby the vertical alignment of discotic columns was confirmed from a uniformly dark view of the device. This indicates that the π-electron resonance planes of the liquid crystal molecules were aligned substantially parallel to the electrode surfaces. A similar alignment was confirmed also when the HHOT layer thickness was increased to 150 nm. The thus-formed parallel π-electron plane alignment is believed to have caused an increased interaction with electron cloud at the ITO surface, thereby promoting the hole injection.)

EXAMPLE 2

On a glass substrate, a 70 nm-thick ITO film was formed by sputtering similarly as in Example 1 and then subjected to an oxygen-plasma treatment under the conditions of $O_2$ gas flow rate of 200 sccm, a pressure of 10 m.torr, a power of 400 W and a treatment time of 4 min., whereby the ITO film was caused to have an elevated work function of approximately 4.93 eV.

The above-treated substrate having an ITO film was coated with a carrier transporting layer comprising a lamination of a 20 nm-thick HHOT layer and a 50 nm-thick HBOT layer. The HHOT layer and the HBOT layer were respectively formed by the resistance heating vacuum deposition method at a pressure of $1\times10^{-5}$ torr and a deposition rate of approximately 0.1 mm/sec successively in the same vacuum chamber with an intermediate re-evacuation step. HBOT exhibited a mobility of $1\times10^{-2}$ $cm^2/V.sec$ at approximately 70° C. or below according to the time-of-flight method. HBOT is a discotic liquid causing a transition from crystal to discotic ordered phase at 89.4° C. and a transition to isotropic phase at 144.7° C.

Then, luminescent organic layers 4a–4c and cathode metals 5 were formed in the carrier transporting layer 3 similarly as in Example 1 to obtain an organic EL device. The device was heated to 75° C., whereby electroluminescence was realized at an increased current at that temperature.

Comparative Example 1

An organic EL device was prepared in the same manner as in Example 2 except that a carrier transporting layer was formed on the ITO layer by first forming a 20 nm-thick HBOT layer and then forming a 50 nm-thick HHOT layer thereon.

Comparative Example 2

A glass substrate was coated with an ITO film and treated by UV treatment in the same manner as in Example 1.

The ITO film on the substrate was further coated with a carrier transporting layer comprising in lamination a 20 nm-thick layer of CuPc (copper-phthalocyanine), having a structure represented by the formula below and a 50 nm-thick layer of HHOT, respectively, formed by vacuum deposition under conditions similar to those adopted for the vacuum deposition of the HHOT layer in Example 1.

CuPc

Then, luminescent organic layers 4a–4c and cathode metals 5 were formed on the carrier transporting layer 3 similarly as in Example 1 to obtain an organic EL device.

The above-prepared 4 devices of Examples 1–2 and Comparative Examples 1–2 were respectively supplied with an electric field of 12 V/100 nm at various temperatures (30° C. and a liquid crystal phase temperature) to measure a current density. The results are inclusively shown in Table 1 below.

TABLE 1

| Example | Layer structure | Temp. (° C.) | Current density ($\mu A/cm^2$) 12 V/100 nm | Current ratio |
|---|---|---|---|---|
| 1 | ITO/HHOT/Alq3/ AlLi/Al | 30 65 | 50 3593 | 1 71.9 |
| 2 | ITO/HHOT/HBOT/ Alq3/AlLi/Al | 30 65 | 50 3500 | 1 70.0 |
| Comp. 1 | ITO/HHOT/HHOT/ Alq3/AlLi/Al | 30 90 | 140 600 | 2.8 12.0 |
| Comp. 2 | ITO/CuPc/HHOT/ Alq3/AlLi/Al | 30 65 | 1136 1145 | 22.7 22.9 |

As is shown in Table 1 above, the device of Example 1 exhibited only a low current density of 50 $\mu A/cm^2$ at 30° C. (crystal phase temperature for HHOT) where HHOT was presumably in an amorphous state after the vacuum deposition, but exhibited a remarkably increased current density of 3593 $\mu A/cm^2$ when heated to 65° C. (to 68° C.) where it was confirmed that HHOT was placed in discotic disordered phase and in a homeotropic alignment state where the director (defined as a vector perpendicular to a π-electron resonance plane of a core of a discotic liquid crystal) of HHOT was perpendicular to the ITO film between the ITO film and the Alq3 film. This means that the π-electron resonance plane of HHOT was aligned parallel to the ITO electrode surface. Incidentally, a discotic liquid crystal has a negative refractive index anisotropy, so that no phase difference is formed in a direction perpendicular to the electrode surface when the discotic liquid crystal is placed in the homeotropic alignment state where the above-defined director is aligned normal to the electrode surface. For this reason, an alignment state of a discotic liquid crystal can be specified through a polarizing microscope observation.

On the other hand, the device of Comparative Example 1 exhibited a current density of 140 $\mu A/cm^2$ at 30° C. somewhat higher than the device of Example 1. This is presumably because HBOT, which has a mobility higher by one digit than HHOT, was used in Comparative Example 1.

The device of Comparative Example 1 did not exhibit a remarkable increase in current density unlike the device of Example 1 when heated to 90° C. This is presumably because HBOT assumes discotic ordered phase at 90° C. and does not have discotic disordered phase. As a result of observation of actual alignment state in a device, HHOT assumes a homeotropic alignment state wherein the director is aligned in agreement with a normal to the substrate as mentioned above, whereas HBOT does not readily assume a homeotropic alignment state but assumes a substantially random alignment state.

On the other hand, the device of Example 2 caused a remarkable increase in current density similarly as in Example 1 when heated to 65° C. This may be attributable to an improvement in carrier injection efficiency at the boundary between the ITO film and the HHOT layer due to alignment of HHOT.

In the device of Example 2, the increase in current density was observed in some cases even at a temperature somewhat below the phase transition temperature (65° C.) where the liquid crystal portion was not considered to completely form a homeotropic alignment. This may be attributable to a feature that a microscopic alignment change favoring the improvement in carrier injection at the electrode boundary can be relatively easily caused in discotic disordered phase.

On the other hand, the device of Comparative Example 2, including a 20 nm-thick CuPc layer inserted between the ITO electrode and the HHOT layer, exhibited a remarkably larger current density of 1136 $\mu A/cm^2$. This is presumably because CuPc has a HOMO of 4.09 eV, which is lower than an HHOT's HOMO of 5.13 eV and provided a reduced energy barrier of 0.09 eV, reduced from 0.53 eV relative to the ITO's work function of 4.60 eV.

However, the device of Comparative Example 2 did not cause a substantial increase in current density even when heated to 65–68° C. This is presumably because CuPc has no liquid crystal phase in a temperature range of 65–68° C., and a carrier injection efficiency improvement by realignment of the π-electron resonance plane, as in the device of Example 1, cannot be expected.

Incidentally, in a device having a layer structure of ITO/HHOT/CuPc/Alq3/AlLi, which is a layer order different from ITO/CuPc/HHOT . . . in the device of Comparative Example 2, an increase in current density accompanying a temperature increase was observed similarly as in Example 1. Accordingly, the current density increase due to a temperature increase may be attributable to an improvement in carrier injection efficiency at the ITO/HHOT boundary.

EXAMPLE 3

An organic EL device was prepared in the same manner as in Example 1, except that a 50 nm-thick layer of PN84 (a bar-shaped smectic liquid crystal) was formed by vacuum deposition, instead of the HHOT layer, under the conditions of a pressure of $1 \times 10^{-5}$ torr and a deposition rate of approximately 0.1 nm/sec.

PN84 causes a phase transition from crystal phase to SmE phase (liquid crystal phase) at 68.7° C., a phase transition from SmE phase to SmA phase (liquid crystal phase), and a phase transition of SmA phase to isotropic phase at 131.1° C., and also exhibits a mobility of approximately $10^{-3}$ $cm^2/V.sec$ in SmE phase.

The device was heated to 69° C., whereby good electroluminescence was obtained. At this time, PN84 assumed a homogeneous alignment state wherein the director thereof was aligned parallel to the ITO electrode surface, but in random directions between the ITO electrode and the Alq3 layer. In the case of a bar-shaped liquid crystal like PN84, a director is taken in a molecular long-axis direction so that the director alignment in the carrier transporting layer is parallel to the electrode surface and provides an organic EL device wherein the π-electron resonance plane of the liquid crystal is aligned parallel to the electrode surface.

EXAMPLE 4

An organic EL device having a layer structure similar to the one shown in FIG. 5 was prepared.

A 1.1 mm-thick glass substrate was coated by sputtering with a 50 nm-thick ITO layer, which was surface-cleaned by irradiation with ultraviolet rays.

The ITO layer on the glass substrate was coated with a 50 nm-thick layer of LC Compound 4 (HHOT=hexakis (hexyloxy)triphenylene), as a hole-transporting layer, by vacuum deposition in a vacuum chamber at a pressure of approximately $1 \times 10^{-5}$ torr and a deposition rate of 0.1 nm/sec, while heating the HHOT. Further, a 50 nm-thick stable amorphous layer of Alq3 was formed thereon under similar vacuum deposition conditions.

Then, the Alq3 layer was further coated first with a 10 nm-thick layer of Al—Li alloy (Li 1.8 wt. %) and then with a 150 nm-thick Al layer. The two-layer electrode structure was adopted so as to protect the Al—Li alloy with the Al electrode because the Al—Li alloy has a low work function and a high electron injection performance, while showing poor stability because of a high reactivity with the atmosphere, etc.

Figure 3A:
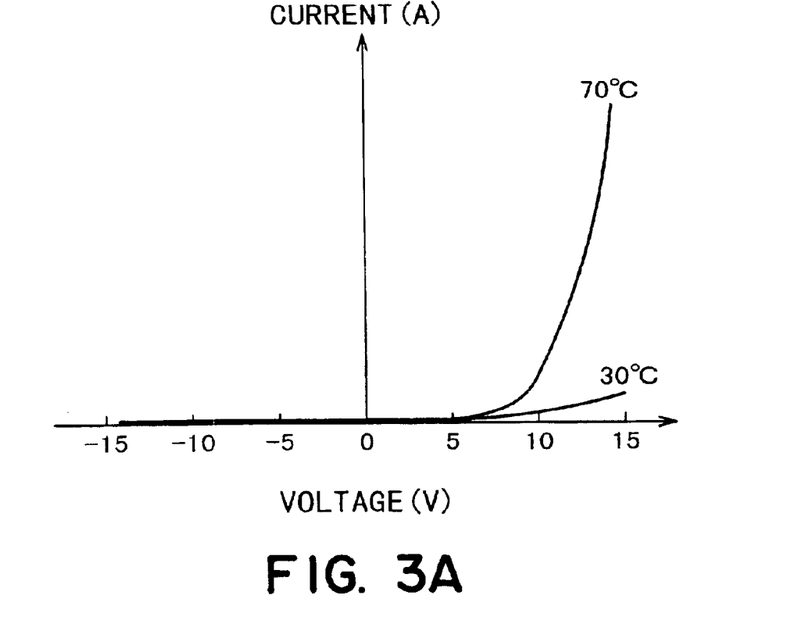
FIGS. 3A and 3B are graphs showing a voltage-current characteristic and a temperature-dependence of current, respectively, of the organic EL device of Example 4.

The device exhibited voltage (V)-current (I) characteristics at 30° C. and 70° C. as shown in FIG. 3A. Luminance was confirmed by the device in a initial state (at 30° C.), i.e., before heating to the liquid crystal phase temperature. The liquid crystal compound HHOT was formed in an amorphous layer by the vacuum deposition method, so that the device was assumed to exhibit a V-I characteristic corresponding to an electrical property in the amorphous state. Thus, the HHOT layer showed a hole-transporting characteristic even in the amorphous state.

HHOT shows Dhd phase (discotic hexagonal disordered phase) within a liquid crystal temperature range of 69–99° C. in the course of temperature increase. The device exhibited a remarkable current increase when heated to 70° C. This is presumably because the molecular alignment in the HHOT layer was transformed into Dhd phase by heating to a liquid crystal phase temperature and the hole-transporting performance of the HHOT layer was increased inclusive of hole-injecting performance from the electrode.

Figure 3B:
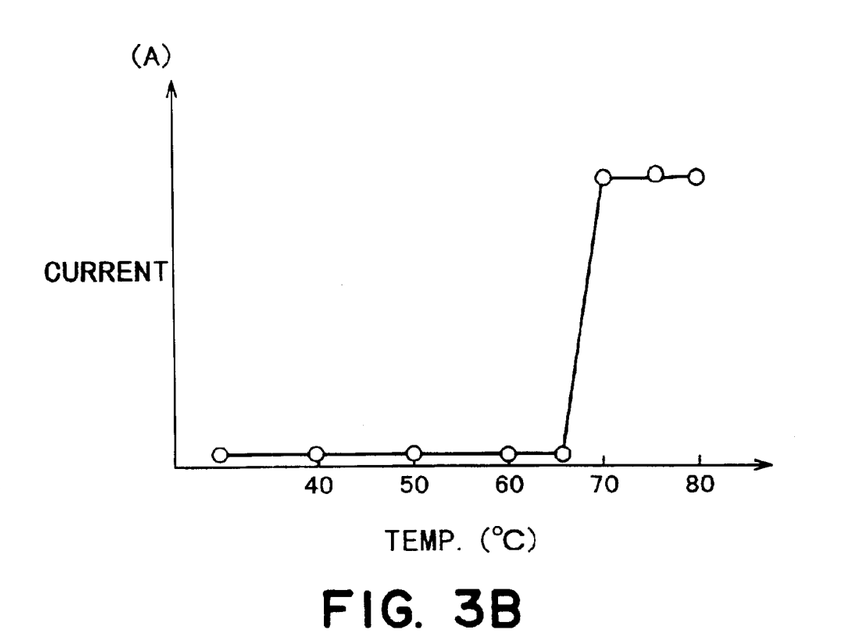

FIG. 3B shows a temperature-dependent current characteristic of the device at a fixed applied voltage of 12 volts. FIG. 3B clearly shows an abrupt increase in current in the vicinity of the temperature at which the phase transitions into a liquid crystal phase. Thus, a dramatic improvement by molecular realignment in the liquid crystal phase is indicated.

Green electroluminescence from Alq3 was confirmed while showing a nearly proportional relationship between the current and luminous intensity. This means that the increased current characteristic provided the increased EL luminescence performance.

In this example, successive formation by vacuum deposition of a hole-transporting layer of a liquid crystal formed in an amorphous state and a luminance layer demonstrated that the liquid crystal layer exhibited a good hole-transporting performance and that the device caused luminance at both the liquid crystal phase temperature and the crystal phase temperature of the liquid crystal, with a particularly higher luminance performance at liquid crystal phase temperatures.

The alignment characteristic of the liquid crystal in the device was examined by observation through a polarizing optical microscope. For the examination, a sample device having a layer structure of ITO (50 nm)/HHOT (200 nm)/ Alq3 (50 nm) was prepared because such an optical microscope examination preferred a liquid crystal layer thickness of at least 200 nm and the absence of a metal electrode. In the layer structure, the Alq amorphous layer does not show birefringence, so that the alignment of HHOT can be examined by observation of the device through a cross nicol polarizing microscope. For the purpose of comparison, the region of HHOT above (i.e., free from coverage with Alq3) was also formed in the device. The results of the examination are shown in the following Table 2.

TABLE 2

| Layer structure | Alignment | |
| --- | --- | --- |
| | room temp. (crystal) | 70° C. (Dhd phase) |
| HHOT alone | random | random |
| HHOT/Alq3 | random | homeotropic (dark view) |

As shown in Table 2, the HHOT layer formed by vacuum deposition in contact with an amorphous Alq3 layer assumed a homeotropic alignment state at a liquid crystal phase temperature. Incidentally, the random state of HHOT and the homeotropic state of HHOT could be easily differentiated because the former caused light leakage and the latter provided a uniform state free from light leakage as a result of observation through the polarizing microscope.

The above results show that HHOT placed in an alignment state in the crystal phase caused an alignment change when heated to a liquid crystal phase temperature, and the Alq3 amorphous layer exerted an alignment control force to the liquid crystal layer of HHOT. Moreover, it was shown that a good alignment state of the liquid crystal layer was realized without an ordinary realigning treatment of once heating the device to a liquid phase temperature of the liquid crystal and then cooling the device to a liquid crystal phase of the liquid crystal. Thus, in the organic EL device of this Example, the liquid crystal in the hole-transporting layer exhibited a good alignment at a liquid crystal phase temperature.

In this Example, it was also clarified that a high carrier-transporting performance of a liquid crystal compound could be effectively utilized by a combination of a carrier transporting layer comprising a liquid crystal compound and an amorphous layer comprising a luminescence material such as Alq3 stably providing an amorphous state.

Comparative Example 3

An organic EL device was prepared in the same manner as in Example 4 except that a 50 nm-thick layer of the discotic liquid crystal compound HHOT was formed by spin coating instead of the vacuum deposition.

More specifically, a glass substrate coated with an ITO film identical to the one prepared in Example 4 was coated with a 1 wt. % HHOT solution in chloroform (CHCl$_3$) by spin coating at 2000 rpm for 20 sec, followed by drying to form a 50 nm-thick HHOT layer.

The HHOT layer was then successively coated with an Alq3 layer, an Al—Li layer and an Al layer respectively by vacuum deposition in the same manner as in Example 4.

The thus-obtained device was subjected to measurement of V-I characteristic in the same manner as in Example 4. As a result, under application of an identical voltage of 10 volts at an identical liquid crystal phase temperature of 70° C., the device exhibited a current value of approximately 1/15 and a luminous intensity of approximately 1/20, respectively, of those of the device of Example 4.

EXAMPLE 5

An organic EL device including three organic compound layers was prepared. More specifically, an ITO film formed on a glass substrate identical to the one in Example 4 was successively coated with a 20 nm-thick layer of α-NPD, a 50 nm-thick layer of the above-mentioned discotic LC Compound 5 (cyclohexane-carboxylic acid-3,6,7,10,11-pentakispentyloxy-triphenylene-2-yl-ester) and a 50 nm-thick layer of Alq3 respectively by vacuum deposition under similar conditions as in Example 4. LC Compound 5 is a discotic liquid crystal compound showing a liquid crystal phase at 189° C. or below including Dhd phase (discotic hexagonal ordered phase) at room temperature. Then, an Al—Li layer and an Al layer were formed thereon in the same manner as in Example 4.

The thus-prepared device also showed good rectifying performance causing electroluminescence.

Similar to Example 4, the alignment characteristic of LC Compound 5 in the device was examined by preparing a sample device having a layer structure of ITO (50 nm)/α-NPO (20 nm)/LC Compound 5 (200 nm)/Alq3 (50 nm). As a result, it was confirmed that LC Compound 5 was placed in a good homeotropic alignment state free from light leakage by observation under cross nicols at the liquid crystal phase temperature.

EXAMPLE 6

An organic EL device having a layer structure as shown in FIG. 6, including an electron-transporting layer 6 comprising the above-mentioned smectic liquid crystal compound PN84 (2-butoxy-6-(4-octyl)naphthalene), was prepared.

More specifically, an ITO electrode formed on a glass substrate identical to the one formed in Example 4 was successively coated with a 50 nm-thick hole-transporting layer of α-NPD, a 50 nm-thick luminescence layer of Alq3 and a 50 nm-thick layer of PN84, respectively by vacuum deposition under similar conditions as in formation of the HHOT and Alq3 in Example 4. PN84 is a liquid crystal compound showing bipolar carrier-transporting characteristics, but was used for constituting an electrode-transporting layer. PN84 shows a liquid crystal phase in a temperature range of 55–129° C.

In the organic EL device thus prepared, electroluminescence was confirmed even at room temperature where PN84 was placed in an amorphous state. Further, when the device was heated to 60° C., the current value was increased to approximately 5 times that at room temperature and high electroluminescence was confirmed.

Similar to Example 4, the alignment characteristic of the liquid crystal PN84 was examined by preparing a sample device having a layer structure of ITO (50 nm)/α-NPD (50 nm)/Alq3 (50 nm)/PN84 (200 nm). As a result, it was confirmed that PN84 was in a random alignment with no directionality at room temperature, and in a substantially homogeneous alignment on the Alq3 layer at a liquid crystal phase temperature. Accordingly, in the device of this Example, it was understood that the smectic liquid crystal PN84 was in a homogeneous alignment state showing a good carrier transportation characteristic at a liquid crystal phase temperature.

EXAMPLE 7

An organic EL device having a structure shown in FIG. 5 including a 50 nm-thick luminescence layer 4 comprising a smectic liquid crystal PN84 and a hole-transporting layer 3 comprising α-NPD formed by vacuum deposition under similar conditions as in Example 4, was prepared. The electrodes were similar to those formed in Example 4.

Figure 4:
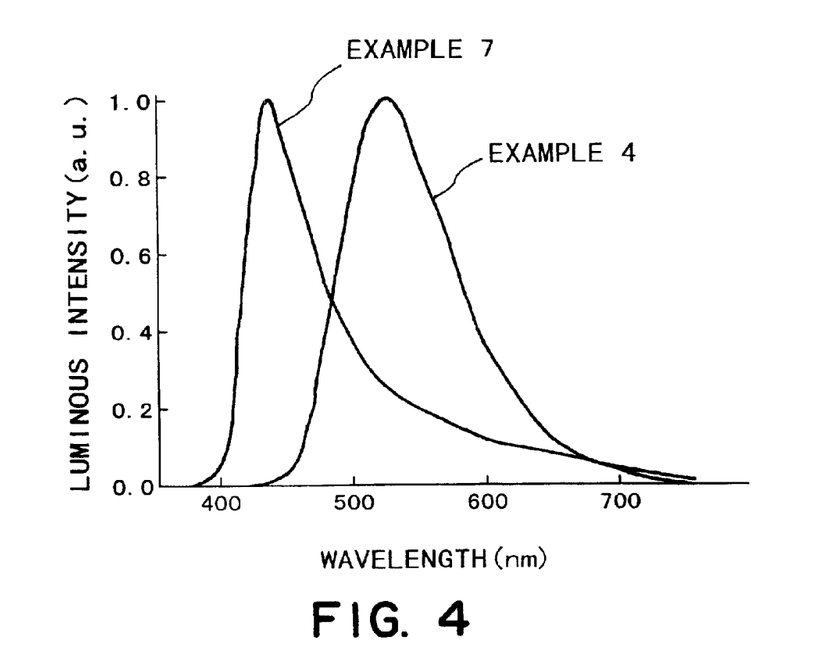
FIG. 4 is a graph showing luminance spectra of organic EL devices of some Examples.

As a result of voltage application for evaluating the V-I characteristic, the organic EL device exhibited a good rectifying performance. As a result, blue luminescence was confirmed while the luminance intensity was weaker than the device of Example 4 using Alq3. The luminance spectra of the devices of Example 4 using Alq3 and Example 7 using PN84 are shown in FIG. 4. When PN84 was excited with ultraviolet rays to examine photoluminescence, as a luminance spectrum substantially similar to the one shown in FIG. 4, the luminescence of the device of this Example 7 was identified as luminance from PN84. Further, when the device of this Example was heated to a liquid crystal temperature of 60° C., the current was increased to three times and the luminous intensity was increased to approximately 2.5 times the respective values at 30° C.

What is claimed is:

1. An organic electroluminescence device comprising:

a pair of oppositely spaced electrodes; and a carrier transporting layer and a luminescent organic layer disposed in lamination between the electrodes so that the carrier transporting layer is disposed in contact with one of the electrodes, wherein the carrier transporting layer comprises a conductive liquid crystal having a π-electron resonance structure in its molecule, and the π-electron resonance structure plane of the conductive liquid crystal in the carrier transporting layer is aligned substantially parallel to surfaces of the electrodes, wherein the conductive liquid crystal is a discotic liquid crystal, and wherein the conductive liquid crystal is in a discotic disordered phase or a liquid crystal phase having a lower order than the discotic disordered phase.

2. The electroluminescence device according to claim 1 wherein the luminescent organic layer and the carrier transporting layer comprising the conductive liquid crystal have been formed by vacuum deposition.

3. The electroluminescence device according to claim 1, wherein the substantially parallel alignment of the π-electron structure plane of the conductive liquid crystal in the carrier transporting layer has been achieved by a heat treatment of the device.

4. The electroluminescence device according to claim 2, wherein the luminescent organic layer is in an amorphous state.

* * * * *

UNITED STATES PATENT AND TRADEMARK OFFICE
CERTIFICATE OF CORRECTION

PATENT NO. : 6,858,271 B1  
APPLICATION NO. : 09/656942  
DATED : February 22, 2005  
INVENTOR(S) : Shinjiro Okada et al.

Page 1 of 2

It is certified that error appears in the above-identified patent and that said Letters Patent is hereby corrected as shown below:

COLUMN 10:

Lines 1-12, "  " should read

--  --; and

UNITED STATES PATENT AND TRADEMARK OFFICE
CERTIFICATE OF CORRECTION

PATENT NO.         : 6,858,271 B1
APPLICATION NO. : 09/656942
DATED              : February 22, 2005
INVENTOR(S)        : Shinjiro Okada et al.

It is certified that error appears in the above-identified patent and that said Letters Patent is hereby corrected as shown below:

Lines 14-19, "  "

should read

--  --

Signed and Sealed this

Thirtieth Day of January, 2007

JON W. DUDAS
*Director of the United States Patent and Trademark Office*